WIDE BAND SIGNAL INVERTER CIRCUIT HAVING SEPARATE PATHS FOR HIGH AND LOW FREQUENCY SIGNAL PORTIONS

Filed Feb. 3, 1964

INVENTOR.
GEORGE J. FRYE

BY
BUCKHORN, BLORE, KLARQUIST & SPARKMAN

ATTORNEYS.

3,281,705
WIDE BAND SIGNAL INVERTER CIRCUIT HAVING SEPARATE PATHS FOR HIGH AND LOW FREQUENCY SIGNAL PORTIONS

George J. Frye, Portland, Oreg., assignor to Tektronix, Inc., Beaverton, Oreg., a corporation of Oregon Filed Feb. 3, 1964, Ser. No. 341,980
9 Claims. (Cl. 330—30)

Figure 1:
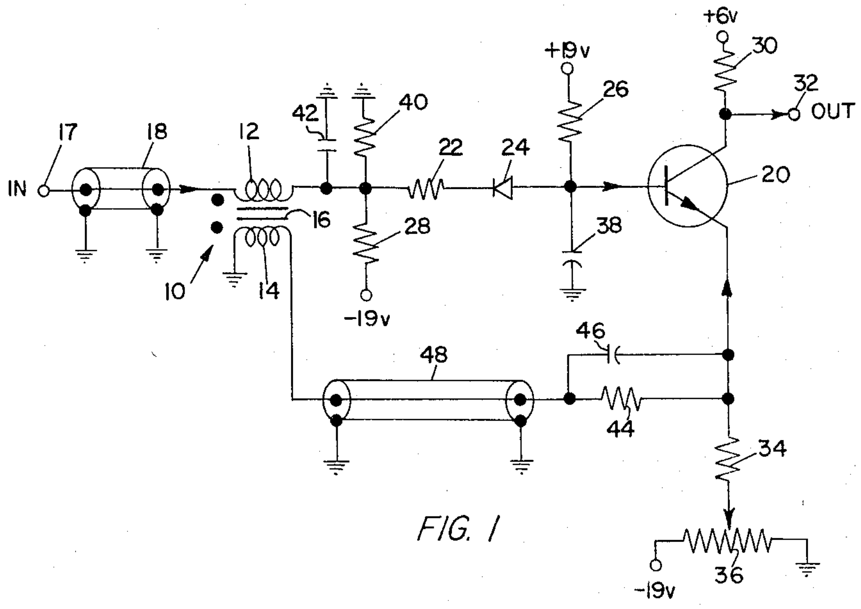

The subject matter of the present invention relates generally to electrical circuits for reversing the phase of electrical signals, and in particular to a signal inverter circuit which provides separate current paths for high frequency and low frequency input signals respectively in order to reverse the phase of such input signals with substantially no wave form distortion over a wide band of frequencies.

The signal inverter circuit of the present invention is especially useful when employed in D.C. coupled high frequency electronic apparatus, such as cathode ray oscilloscopes, which are capable of operating over an extremely wide range of frequencies from D.C. up to about 1000 megacycles and may be used as a trigger take-off circuit for a sampling oscilloscope. The present inverter circuit has several advantages over conventional inverter circuits including a linear response over a wide range of frequencies. In addition, the present signal inverter circuit employs few components so that it is simple and inexpensive to make. Furthermore this circuit operates in an efficient troublefree manner and, when used as a trigger take-off circuit, it extracts a portion of the input signal without distorting the remainder of such input signal. Also, the present signal inverter circuit may be connected so that it provides a substantially constant current gain of one over a wide range of frequencies.

Briefly one embodiment of the present signal inverter circuit employs a phase inversion transformer to provide a high frequency signal path through the secondary winding of such transformer to the emitter of a transistor which is connected as a common base amplifier for high frequency input signals. The primary winding of such transformer provides a separate low frequency signal path to the base of the same transistor so that such transistor is connected as a common emitter amplifier for low frequency input signals.

It is therefore one object of the present invention to provide an improved signal inverter circuit having a linear response over a wide range of frequencies.

Another object of the present invention is to provide an improved signal inverter circuit which reverses the phase of an input signal with substantially no wave form distortion over a wide range of frequencies by providing separate current paths for high frequency signals and low frequency signals.

A further object of the invention is to provide an improved signal inverter circuit of simple and inexpensive construction which operates in an efficient and troublefree manner.

An additional object of the present invention is to provide an improved current inverter circuit having a gain of unity over a wide range of frequencies from D.C. to about 1000 megacycles per second.

Still another object of the present invention is to provide an improved trigger take-off circuit which transmits a portion of an input signal to a first output terminal as an inverted trigger signal and transmits the remainder of such input signal to a second output terminal without distorting the wave form of the remainder of such input signal or such trigger signal over a wide range of frequencies.

Figure 2:
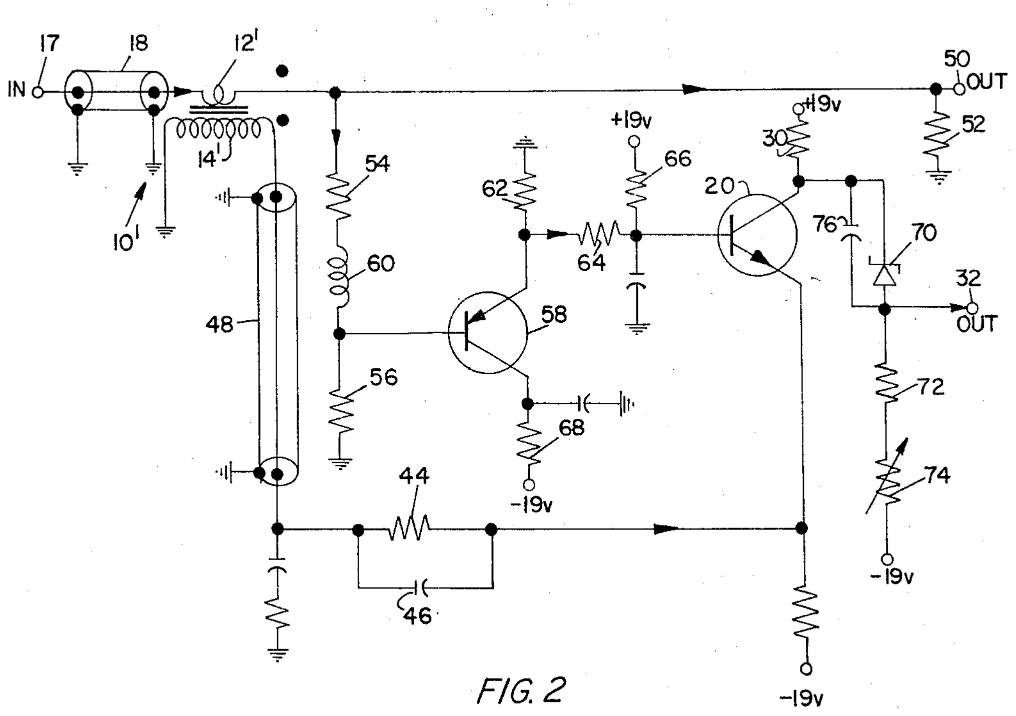

Other objects and advantages of the present invention will be apparent from the following detailed description of certain preferred embodiments thereof and the attached drawings, of which:

FIG. 1 is a schematic diagram of one embodiment of the signal inverter circuit of the present invention; and FIG. 2 is a schematic diagram of another embodiment of the present signal inverter circuit which may be employed as a trigger take-off circuit.

As shown in FIG. 1, one embodiment of the signal inverter circuit of the present invention includes a phase inversion transformer 10 having a primary winding 12 and a secondary winding 14 each formed by an equal number of turns wound in bifilar fashion on a core 16 of ferrite magnetic material. Connections to the transformer are made in such a manner that signals are transmitted through it in a transmission line mode and the signal induced in the secondary winding is opposite in phase to the signal applied to the input of the primary winding. The input end of the primary winding 12 is connected at input terminal 17 to a source of input current signals (not shown), having a source impedance of about 50 ohms, through the inner conductor of a coaxial cable 18 having a uniform characteristic impedance of 50 ohms with its outer conductor grounded. The output end of the primary winding 12 is connected to the base of an output transistor 20 of the NPN type 2N918, through a coupling resistor 22 of 82 ohms and a diode 24 of PN type 1N3605. This diode is normally forward biased so as to be conducting by a positive D.C. voltage source of about +19 volts connected to the anode of such diode through a bias resistor 26 of 10 kilohms, and a negative D.C. bias voltage of about −19 volts connected to the cathode of such diode through a second bias resistor 28 of 10 kilohms and coupling resistor 22.

The diode 24 provides temperature compensation for the output transistor since such diode is maintained at substantially the same temperature as the transistor 20 so that a change in voltage drop across the PN junction of such diode compensates for any change in voltage across the emitter junction of the transistor due to heating. When the voltage across the emitter junction of the output transistor decreases with increasing temperature due to the decrease of emitter junction resistance, the voltage on the emitter tends to go more positive which would cause the voltage at output terminal 32 to go more negative. However at the same time, the voltage drop across the diode 24 decreases to apply more positive D.C. voltage to the base of the transistor. This causes the emitter voltage of the transistor to remain substantially the same and maintains the emitter to collector current very nearly constant so that the output voltage at output terminal 32 also remains substantially unchanged regardless of wide temperature variations.

The emitter of transistor 20 is connected through a fixed bias resistor 34 of 300 ohms to the movable contact of a variable resistance potentiometer 36 of 1 kilohm whose end terminals are connected between a source of negative D.C. bias voltage of about −19 volts and ground. The setting of the potentiometer 36 controls the D.C. voltage level at output terminal 32. A bypass capacitor 38 of 100 picofarads may be connected from the base of transistor 20 to ground so that all high frequency input signals transmitted through diode 24 are bypassed to ground. A low frequency termination resistor 40 of 51 ohms is connected to ground from the common connection between the primary winding 12 and the coupling resistor 22 to terminate the output end of the coaxial cable 18 in its characteristic impedance. Since the resistance of the termination impedance including resistor 40 is equal to the characteristic impedance of the coaxial cable, there are no signal reflections from such termination resistor which could cause distortion of the input signal.

Termination resistor 40 is connected in parallel with the impedance of resistors 26, 28 and 22, so that the value of the total termination impedance is approximately equal to the 50 ohms characteristic impedance of the coaxial cable. In addition, a shunt capacitor 42 of .001 microfarad is connected in parallel with the termination resistor 40. This shunt capacitor forms part of a low pass filter which transmits low frequency input signals and shunts high frequency input signals to ground by effectively short circuiting the termination resistor 40 at the high frequencies. As a result, only relatively low frequency input signals are passed or transmitted from input terminal 17 to the base of transistor 20 so that such transistor acts as a common emitter amplifier at low frequencies to invert such signals and transmit them to the output terminal 32.

One terminal of the secondary winding 14 is grounded and the other terminal of such winding is connected through a coupling resistor 44 of 43 ohms to the emitter of transistor 20. Thus for high frequency input signals, the input signal current in the primary winding 12 induces a signal current in the secondary winding 14 opposite in phase to such input current. This phase inverted signal is then transmitted through coupling resistor 44 to the emitter of transistor 20 which applies it to the output terminal 32 wihout a further phase reversal. Thus transistor 20 operates as a common base amplifier for high frequency signals since shunt capacitor 42 effectively grounds the base of such transistor at high frequencies. A high frequency compensation capacitor 46 of 4.7 picofarads is connected across the coupling resistor 44 to transmit the leading edge of extremely fast rise time signals directly to the emitter of transistor 20 in order to compensate for the lack of gain in such transistor at very high frequencies. Also, a coupling coaxial cable 48 having a characteristic impedance of 50 ohms may be connected between the secondary winding 14 and the coupling resistor 44 if such coupling resistor is located any appreciable distance from such winding, in order to prevent distortion of the high frequency signals due to lead wire inductance.

For medium frequencies which lie in the range in which the low pass filter formed by the resistance 40 and the bypass capacitor 42 allow only partial transmission of signal voltages to the base of transistor 20, the transistor operates both as a common base amplifier and as a common emitter amplifier. At frequencies in this range, the inverted output current signal on the collector of transistor 20 consists of components derived from signal voltages developed across the base resistance 40 as well as signal voltages developed across the secondary winding 14 of the transformer 10.

Since the turns ratio of the primary and secondary windings 12 and 14 in the inverter circuit of FIG. 1, is 1 to 1 and the current gain of a transistor connected on a common base amplifier is also approximately 1, the high frequency output signals transmitted to the output terminal 32 have the same current amplitude as the high frequency input signals supplied to input terminal 17. Also, the sum of the resistance of the coupling resistor 44 and the resistance of the emitter junction of transistor 20 provides an emitter resistance of approximately 50 ohms which is equal to the base input resistance of the termination resistor 40. The same signal voltage drop is produced across such emitter resistance as is produced across such base resistance due to emitter follower action. Since the signal voltage drops across the emitter resistance and the base resistance are equal to each other, the emitter signal current is equal to the input signal current and the current gain of the output transistor is unity for low frequency signals also. Thus low frequency signals transmitted to the base of transistor 20 are inverted in phase and transmitted to the output terminal 32 as low frequency output signals of the same amplitude but opposite polarity to such input signals. The current gains at the medium frequencies referred to above is also unity because the isolator character of the emitter follower action of transistor 20 causes the voltage which appears across the transformer windings to always equal the difference between the voltage of the input signal as seen at the input 17 and the value of voltage across the termination resistor 40. The time constant of the capacitor 42 and the base resistance 40 thus controls the position of the crossover frequency range in the frequency bandwidth of the signal inverter circuit. As a result, the inverter circuit of FIG. 1 has a unity current gain with substantially no wave form distortion over a wide range of frequencies from D.C. to 1000 megacycles. It should be noted that the transformer 10 is obviously not a perfect transformer since there are some core losses and flux leakage. However, if the time constant of the series RC circuit including termination resistor 40 and shunt capacitor 42 is made very small compared with a time constant of the series LC circuit formed by the inductance of the secondary winding 14 and the coupling resistor 44, the above analysis holds.

Another embodiment of the inverter circuit of the present invention is shown in FIG. 2 to be similar to that of FIG. 1, so that the same reference numerals have been employed to designate similar components. However, in this embodiment, the inverter circuit is employed as part of a trigger take-off for extracting a portion of an input signal without distorting the remainder of such input signal in order to employ such input signal portion as a trigger signal. In order to accomplish this the turns ratio of the primary winding 12' to the secondary winding 14' of the base inversion transformer is changed to a 1:7 ratio and the output end of the primary winding is connected to a second output terminal 50 across a load resistor 52 of 50 ohms. The load resistor 52 functions in a similar manner to the termination resistor 40 of FIG. 1 in that it terminates the output end of the coaxial cable 18 for all bandwidth frequencies so that substantially no signal reflections occur from such termination to cause signal distortion.

The output terminal of the primary winding 12' is also connected to ground through a 7 to 1 voltage divider formed by resistor 54 of 2.14 kilohms in series with a resistor 56 of 357 ohms. The base of an emitter follower transistor 58 of PNP type is connected between voltage divider resistors 54 and 56 so that the signal voltage developed across resistor 56 serves as the input signal of such transistor. It should be noted that the resistance ratio of resistor 56 to that of the total resistance of the voltage divider including resistors 54 and 56 is the opposite of the turns ratio of transformer 10' so that the proportion of low frequency input signal voltage applied to the base of transistor 58 is the same as the proportion of high frequency input signal voltage developed across the secondary winding 14'.

A blocking or choke inductance 60 of .25 millihenry is connected between the base of transistor 58 and resistor 54 in order to prevent high frequency input signals from being transmitted to such transistor. The inductance of the blocking inductor 60 is sufficient so that the time constant of the series LR circuit of such inductor and resistors 54 and 56 is very small compared to the time constant of the inductance of the secondary winding 14' and the emitter load resistance of transistor 20 including coupling resistor 44 so that transformer 10' operates more nearly as an ideal transformer. Blocking inductance 60 functions as a low pass filter in a similar manner to the shunt capacitor 42 FIG. 1, since it prevents the transmission of high frequency signals.

The emitter of transistor 58 is connected through a load resistor 62 of 470 ohms to ground. This load resistor forms the main load of the emitter follower transistor 58 with additional emitter current being supplied through a resistor 64 of 10 ohms and a resistor 66 of 3.8 kilohms which is connected to a positive D.C. bias voltage of +19 volts. The voltage developed across the 10-ohm resistor 64 is used to help compensate for the difference in voltage drop across the emitter to base junctions of transistors 58 and 20, respectively. The collector of transistor 58 is connected to a source of negative D.C. bias voltage of about −19 volts through a resistor 66 of 3.8 kilohms. Thus transistor 58 is connected as an emitter follower amplifier which is normally biased so as to be conducting. Since the current gain of an emitter follower is unity and there is no phase inversion, the low frequency input signal applied to the base of transistor 58 is also applied to the base of output transistor 20. It should be noted that the emitter follower transistor 58 replaces the diode 24 of FIG. 1 as temperature compensation for the output transistor, since the emitter junction of such transistor is maintained at substantially the same temperature as that of transistor 20. Thus any changes in voltage drop across the emitter junctions of such transistors due to temperature, compensate for one another to maintain the D.C. voltage on the emitter of transistor 20 substantially constant. In addition to temperature compensation, emitter follower transistor 58 also functions as an impedance matching device to reduce the input impedance of transistor 20 from the relatively high value of resistor 56 to the low resistance characteristic of the output resistance of an emitter follower.

It should be noted that the output transistor 20 operates as a grounded base amplifier for high frequency input signals since such high frequency signals are blocked by inductor 60 and transmitted through the secondary winding 14′ and coupling resistor 44 to the emitter of such transistor. The normal D.C. bias voltage applied to the base of transistor 20 is about −.6 volt since the base of transistor 58 is at zero volts and there is a positive .6 volt voltage drop across the emitter junction of such transistor.

The remainder of the circuit is substantially the same as that of FIG. 1, except that a zener diode 70 is connected between the collector of transistor 20 and the output terminal 32 to enable such output terminal to be held at a D.C. voltage of zero volts. The cathode of the diode 70 is connected to resistor 30 while the anode of such diode is connected to a source of negative D.C. bias voltage of about −19 volts through a fixed bias resistor 72 of 2.7 kilohms and a variable bias resistor 74 of 2.5 kilohms. The variable resistor 74 controls the current flow through zener diode 70 and resistor 30 to vary the D.C. voltage level on the output terminal 32. A bypass capacitor 76 of 1 microfarad may be connected in parallel with the zener diode for high frequency compensation and to bypass high frequency noise produced in such zener diode.

Since the load resistor 52 is connected in parallel with the voltage divider formed by resistors 54 and 56, for low frequency input signals, the termination resistance of the coaxial cable 18 formed by this parallel impedance is approximately 49 ohms. For high frequency signals the resistors 54 and 56 do not conduct current because of inductor 60 and approximately 1 ohm is added to load resistance 52 by the phase inverting transformer to provide a termination resistance of 51 ohms, since the impedance transfer of such transformer is proportional to the square of the turns ratio. The emitter load impedance of transistor 20 including coupling resistor 44 is approximately 50 ohms and the turns ratio of the primary winding to the secondary winding of transformer 10′ is 1 to 7. Therefore the impedance seen by the primary winding is equal to 50 ohms times $(1/7)^2$, or $50 \times 1/49$ which is approximately equal to 1 ohm. Thus the termination resistanceof coaxial cable 18 is approximately 51 ohms for high frequency input signals because substantially no current flows through the voltage divider resistors 54 and 56 at high frequencies. Since the termination resistance remains substantially constant for both high and low frequencies, there is no distortion of the input signal due to signal reflections from the termination impedance.

This is extremely important in trigger take-off circuits since both the remaining input signal transmitted as the output signal from terminal 50 and the output trigger signal transmitted from output terminal 32 must have substantially the same wave form as the input signal applied to input terminal 17.

It will be obvious to those having ordinary skill in the art that various changes may be made to the above described preferred embodiments of the present invention. For example, the signal inverter circuit of FIG. 1 can be used to amplify current by using a step down phase inversion transformer with a lower emitter load impedance. Also vacuum tubes can be substituted for transistors or different types of transistors can be used. Of course, the values of resistors, capacitors and inductors can be changed from those given by way of example. Therefore the scope of the present invention should only be determined by the following claims:

I claim:

1. A signal inverter circuit for reversing the phase of an electrical signal with substantially no distortion over a wide band of frequencies, comprising:

a phase inverting transformer having a primary winding and a secondary winding, said primary winding having an input at one end and an output at the other end thereof;

a shunt resistance connected between the output of said primary winding and a point of D.C. reference potential;

a signal translating device having an emitting electrode, a control electrode and a collecting electrode with said control electrode connected to the output of said primary winding;

an input terminal connected to the input of said primary winding;

a coupling resistance connected between said secondary winding and the emitting electrode of said device to transmit a high frequency portion of an input signal applied to said input terminal, through said secondary winding as an inverted input signal to said emitting electrode;

filter means including a reactance impedance connected to said shunt resistance to prevent high frequency input signals from being applied to the control electrode of said device and to transmit a low frequency portion of said input signal to said control electrode; and an output terminal connected to the collecting electrode of said device to transmit an inverted output signal therefrom which has substantially the same wave form as said input signal.

2. A signal inverter circuit for reversing the phase of an electrical signal with substantially no distortion over a wide band of frequencies, comprising:

an input terminal;

a phase inverting transformer having a primary winding and a secondary winding, said primary winding having an input at one end and an output at the other end thereof;

a transmission line having a uniform characteristic impedance and connected between said input terminal and the input of said primary winding;

a shunt resistance connected between the output of said primary winding and a point of D.C. reference potential and having a resistance approximately equal to said characteristic impedance;

a signal translating device having an emitting electrode, a control electrode and a collecting electrode with said control electrode connected to the output of said primary winding across at least a portion of said shunt resistance;

a coupling resistance connected between said secondary winding and the emitting electrode of said device to transmit a high frequency portion of the input signal applied to said input terminal through said secondary winding as an inverted input signal to said emitting electrode;

low pass filter means including a reactance impedance connected to said shunt resistance to prevent high frequency input signals from being applied to the control electrode of said device and to enable a low frequency portion of said input signal to be transmitted to said control electrode, said reactance impedance and said shunt resistance having a time constant much less than the time constant of said secondary winding and said coupling resistance; and an output terminal connected to the collecting electrode of said device to transmit an inverted output signal therefrom which has substantially the same wave form as said input signal.

3. A signal inverter circuit for reversing the phase of an electrical signal with substantially no distortion over a wide band of frequencies, comprising:

a phase inverting transformer having a primary winding and a secondary winding, said primary winding having an input at one end and an output at the other end thereof;

a shunt resistance connected between the output of said primary winding and a point of D.C. reference potential;

a transistor having an emitter, a base, and a collector with said base connected to the output of said primary winding across at least a portion of said shunt resistance;

an input terminal connected to the input of said primary winding;

a coupling resistance connected between said secondary winding and the emitter of said transistor to transmit a high frequency portion of the input signal applied to said input terminal through said secondary winding as an inverted input signal to said emitter;

a blocking inductance connected between the base of said transistor and the output of said primary winding and in series with said shunt resistance to prevent high frequency input signals from being applied to the base of said transistor and to enable a low frequency portion of said input signal to be transmitted to said base, said inductance and said shunt resistance having a time constant much less than the time constant of the inductance of said secondary winding and said coupling resistance; and an output terminal connected to the collecting electrode of said device to transmit an inverted output current signal therefrom which has substantially the same wave form as said input signal.

4. A trigger take-off circuit for extracting and reversing the phase of a portion of an input signal with substantially no distortion over a wide band of frequencies, comprising:

an input terminal;

a phase inverting transformer having a primary winding and a secondary winding, said primary winding having an input at one end and an output at the other end thereof;

a transmission line having a uniform characteristic impedance connected between said input terminal and the input of said primary winding;

a load resistance connected between the output of said primary winding and a point of D.C. reference potential, said load resistance having a resistance substantially equal to said characteristic impedance;

a first output terminal connected to said load resistance;

a pair of voltage divider resistors connected in series across said load resistor;

a transistor having an emitter, a base, and a collector with said base connected between said voltage divider resistors;

a coupling resistance connected between said secondary winding and the emitter of said transistor to transmit a high frequency portion of the input signal applied to said input terminal through said secondary winding as an inverted input signal to said emitter;

a blocking inductance connected between the output of said primary winding and the base of said transistor through one of said voltage divider resistors to prevent high frequency input current signals from being applied to the base of said transistor and to enable a low frequency portion of said input signal to be transmitted to said base, said inductance and said pair of voltage divider resistors having a time constant much less than the time constant of the inductance of said secondary winding and said coupling resistance; and a second output terminal connected to the collector of said transistor to transmit an inverted output signal therefrom which has substantially the same wave form as said input signal.

5. A current signal inverter circuit having a unity current gain, comprising:

transmission line having a substantially uniform characteristic impedance;

an input terminal connected to the input of said line;

a termination resistance substantially equal to the characteristic impedance of said line;

a phase inverting transformer having a primary winding and a secondary winding with the same number of turns and having its primary winding connected between said termination resistance and the output of said line;

a shunt capacitor connected across said termination resistance;

a transistor having its base connected to the common connection of said shunt capacitor, said primary winding and said termination resistance;

a coupling resistance connected between said secondary winding and the emitter of said transistor, said coupling resistance and the emitter junction of said transistor having total resistance substantially equal to that of said termination resistance; and an output terminal connected to the collector of said transistor.

6. A current signal inverter circuit, comprising:

transmission line having a substantially uniform characteristic impedance;

an input terminal connected to the input of said line;

a termination resistance substantially equal to the characteristic impedance of said line;

a phase inverting transformer having a primary winding and a secondary winding and having its primary winding connected between said termination resistance and the output of said line;

a shunt capacitor connected across said termination resistance;

a transistor having its base connected to the common connection of said shunt capacitor, said primary winding and said termination resistance;

a coupling resistance connected between said secondary winding and the emitter of said transistor;

a load resistance connected to the collector of said transistor;

means for applying a D.C. bias voltage to said transistor to render it normally conducting;

an output terminal connected to said load resistor; and means for varying the D.C. voltage drop across said load resistor to change the D.C. voltage level of said output terminal.

7. A current signal inverter circuit having a unity current gain, comprising:

transmission line having a substantially uniform characteristic impedance;

an input terminal connected to the input of said line;

a termination resistance substantially equal to the characteristic impedance of said line;

a phase inverting transformer having a primary winding and a secondary winding with the same number of turns and having its primary winding connected between said termination resistance and the output of said line;

a shunt capacitor connected across said termination resistance;

a transistor having its base connected to the common connection of said shunt capacitor, said primary winding and said termination resistance;

a coupling resistance connected between said secondary winding and the emitter of said transistor, said coupling resistance and the emitter junction of said transistor having total resistance substantially equal to that of said termination resistance;

a load resistance connected to the collector of said transistor;

means for applying a D.C. bias voltage to said transistor to render it normally conducting;

an output terminal connected across said load resistor; and means including a diode connected between the output of said primary winding and the base of said transistor to maintain the D.C. voltage level at said output terminal substantially constant.

8. A wide band signal inverter circuit, comprising:

means for dividing an input signal into a high frequency signal portion and a low frequency signal portion and providing separate signal paths for the high frequency signal portion and the low frequency signal portion;

signal translating device having an emitting electrode, a control electrode and a collecting electrode;

means provided in said signal path of said high frequency signal portion for reversing the phase of said high frequency signal portion and for applying said reverse phase high frequency signal portion to said emitting electrode to produce a high frequency output signal at said collecting electrode which is reversed in phase with respect to said input signal; and means provided in said low frequency signal path for direct coupling said low frequency signal portion to said control electrode to produce a low frequency output signal at said collecting electrode which is reversed in phase with respect to said input signal and is in phase with said high frequency output signal.

9. A wide band signal inverter circuit, comprising:

an input terminal;

divider means connected to said input terminal, for dividing an input signal applied thereto into a high frequency signal portion and a low frequency signal portion and for providing separate signal paths for said high frequency signal portion and for said low frequency signal portion;

a signal translating device having a pair of input electrodes and an output electrode and acting to reverse the phase of an input signal applied to one of said input electrodes without reversing the phase of an input signal applied to the other input electrode;

an output terminal connected to said output electrode;

inverter means provided in one of said signal paths, for reversing the phase of one of said signal portions and for applying the phase reversed signal portion to said other input electrode; and connection means provided in the other signal path, for applying the other of said signal portions to said one input electrode to cause said signal translating device to reverse the phase of said other signal portion so that the corresponding high and low frequency output signal portions of the phase inverted output signal produced on said output electrode are in phase with each other.

References Cited by the Examiner

UNITED STATES PATENTS

| | | | |
|---|---|---|---|
| 2,395,159 | 2/1946 | Albin | 330—126 X |
| 2,691,074 | 10/1954 | Eberhard. | |
| 2,737,628 | 3/1956 | Haines | 330—126 X |
| 2,760,011 | 8/1956 | Berry | 330—126 |
| 2,771,518 | 11/1956 | Sziklai. | |
| 2,920,189 | 1/1960 | Holmes | 330—14 X |
| 2,961,614 | 11/1960 | Neff | 330—126 |
| 3,206,692 | 9/1965 | Fogle et al. | 330—31 X |

ROY LAKE, *Primary Examiner.*

F. D. PARIS, *Assistant Examiner.*